United States Patent [19]
McLaury

[11] Patent Number: 5,282,177
[45] Date of Patent: Jan. 25, 1994

[54] MULTIPLE REGISTER BLOCK WRITE METHOD AND CIRCUIT FOR VIDEO DRAMS

[75] Inventor: Loren L. McLaury, Boise, Id.

[73] Assignee: Micron Technology, Inc., Boise, Id.

[21] Appl. No.: 865,092

[22] Filed: Apr. 8, 1992

[51] Int. Cl.[5] .............................................. G11C 8/00
[52] U.S. Cl. ........................... 365/230.05; 365/230.02; 365/230.03; 365/230.06
[58] Field of Search ...................... 365/189.01, 230.01, 365/230.03, 230.05, 230.08, 238.5, 230.06, 230.02

[56] References Cited

U.S. PATENT DOCUMENTS

| | | | |
|---|---|---|---|
| 4,566,082 | 1/1986 | Anderson | 365/230.03 |
| 4,725,945 | 2/1988 | Kronstadt et al. | 365/230.03 |
| 4,755,971 | 6/1988 | Jasmer et al. | 365/230.03 |
| 4,933,910 | 6/1990 | Olson et al. | 365/238.5 |
| 5,047,989 | 9/1991 | Canepa et al. | 365/230.03 |
| 5,060,145 | 10/1991 | Scheuneman et al. | 365/230.03 |
| 5,134,583 | 7/1992 | Matsuo et al. | 365/230.03 |
| 5,148,523 | 9/1992 | Harlin et al. | 365/230.08 |

FOREIGN PATENT DOCUMENTS 2-87391  3/1990  Japan ............................ 365/230.08

OTHER PUBLICATIONS

Micron Technology, Inc., Product Brochure, "Multiport Dynamic RAM," 1990.
Micron Technology, Inc., Product News, "1MEG Video RAM—Description & Function," 1989.
Jeff Mailloux, et al., "Designing Solutions With Multiport DRAMs," Electronic Engineering International, Oct., 1991.
Micron Technology, Inc., Brochure, "Triple Port DRAM—256K×4 DRAM With Dual 512×4 SAMs", 1991.
Jeff Mailloux, et al., "Speed Memory, Ease Timing Requirements With VRAM Functions," Nov. 23, 1989, Electronic Design.

Primary Examiner—Eugene R. LaRoche
Assistant Examiner—Tan Nguyen
Attorney, Agent, or Firm—Wells, St. John, Roberts, Gregory & Matkin

[57] ABSTRACT

The specification discloses preferred circuits and methods for performing a block write in a video random access memory circuit (VRAM). The VRAM has a plurality of memory registers, an address bus, and a data bus. The VRAM also has a multiple write register circuit with a plurality of write registers. During write register load cycles, data is written from the data bus to individual write registers which are specified by addresses received on the address bus. During a block write cycle, data is written from an individual write register to a selected block of memory registers; the block having a predefined number of memory registers within a row. The block of memory registers is specified by memory register base address received on the address bus. The memory register base address is the address of the first memory register in the block of memory registers. An individual write register from which data is written to the block of memory registers is selected during a block write cycle by an address received on the data bus.

41 Claims, 16 Drawing Sheets

MULTIPLE REGISTER BLOCK WRITE METHOD AND CIRCUIT FOR VIDEO DRAMS

TECHNICAL FIELD

This invention relates to circuits and methods for performing parallel block writing from write registers to memory registers in a random access memory array.

BACKGROUND OF THE INVENTION

As a preliminary matter, this invention concerns circuits that use voltages to represent binary logic values. Particular circuits may use varying voltage levels to represent the two binary logic values. Accordingly, the words "high" and "low" in this specification refer generally to voltages corresponding to the true and false binary logic values, respectively, within a given sub-circuit. Signals are generally considered "active" when they are high. However, a "*" following the signal name indicates that the signal has negative or inverse logic: the signal is considered active when low. These conventions will be used in the following written discussion. In the drawings, negative logic signals are indicated with a bar over the signal name.

Dual-port RAMs, commonly referred to as video RAMs or VRAMs, offer dramatic speed improvements over standard dynamic RAMs (DRAMs). VRAMs are particularly effective in video display systems and in other applications where high-speed data buffering is required.

A VRAM has an array of dynamic memory cells or registers. The array is accessed through either conventional DRAM control signals or through a serial access memory (SAM). A SAM is essentially a long shift register which receives a block of data from the dynamic memory array and shifts the data out serially through a "serial" port.

VRAMs are particularly useful as frame buffers for video systems. In such video systems, a graphics processor supplies randomly-addressed display frame data to a VRAM memory array as it would to conventional DRAM. The VRAM supplies a serial stream of sequentially-addressed display frame data to color lookup tables and digital-to-analog converters. The serial transfer does not interfere with the graphics processor's random access of the VRAM memory array.

VRAMs and their applications in video systems are well-known. For instance, Micron Technology, Inc., distributes a "1991 MOS Data Book," of which section 3 is hereby incorporated by reference, containing detailed descriptions of Micron's line of VRAMs.

Various features have been incorporated in VRAMs to speed data transfer to and from an associated graphics processor or microprocessor. An article published in *Electronic Design*, Nov. 23, 1989, entitled "Speed Memory, Ease Timing Requirements With VRAM Functions," by Mailloux, et al., describes many of these features, and is also incorporated by reference.

A "block write" function is an example of a feature provided in VRAMs to enhance speed of memory writing. The block write function is useful in a VRAM video frame buffer to quickly clear a large area of frame buffer memory or to create a background for a display window. Instead of writing to just one register the block write function allows simultaneous writing to a block of memory registers. Such a block may comprise an arbitrary or predefined number of memory registers or a logical unit of memory registers such as an entire row of memory registers.

Two types of block write functions are discussed in the following specification. The term "block writing" refers generally to both. The first type of block write function, referred to herein as a "selective block write," allows simultaneous writing to a selected block of four memory registers within a single row of memory registers. The second type of block write function, referred to herein as a "flash block write," allows simultaneous writing to an entire row of memory registers.

The selective block write and flash block write functions may also be used in conjunction with other VRAM features such as the masked write functions described below.

FIG. 1 is a block diagram of a prior art VRAM circuit, designated by the reference numeral 10, which includes both types of block write functions. Additional circuits and signals, not shown, are of course necessary to the operation of VRAM 10, as those familiar with this technology will recognize. Such circuits and signals are omitted here for the sake of simplicity, and to focus the reader's attention on VRAM elements which relate more specifically to the invention.

VRAM 10 comprises dynamic random access memory (DRAM) circuits similar in structure and function to those found in conventional DRAM devices, such as referred to in Section 1 of Micron's 1991 MOS Data Book. A DRAM array 12 in VRAM 10 comprises an array of dynamic memory cells forming eight-bit memory registers for storing binary-coded data. DRAM array 12 is arranged logically as eight planes, each plane having addressed rows and columns of memory cells. Each eight-bit memory register is made up of memory cells from the eight planes having the same row and column addresses. DRAM array 12 thus forms addressed rows and columns of eight-bit memory registers.

A microprocessor (not shown) accesses VRAM 10 through a data bus 14, a multiplexed address bus 16, row and column address strobe signals RAS* and CAS*, a special function signal DSF, a mask enable/write enable signal ME*/WE*, and by using other conventional control signals which are not shown. Address bus 16 receives individual address signals A0 through A8 from the microprocessor. Data bus 14 produces and receives individual data signals DQ1 through DQ8.

A row address latch/buffer 20 and a row decoder 22 receive a row address signal from multiplexed address bus 16, decode a row address therefrom, and address or activate the corresponding row of DRAM array 12. A column address latch/buffer 24 and a column decoder 26 receive a column address signal from address bus 16, decode a column address therefrom, and address or activate the corresponding column of DRAM array 12. During block write cycles, column decoder 26 simultaneously addresses and writes to a block of memory registers comprising either an entire addressed row of memory registers or a consecutively-addressed block of four memory registers within an addressed row.

Data bus 14 receives memory register data during a write cycle from the microprocessor and supplies it to column decoder 26 for writing to DRAM array 12. Column decoder 26 produces memory register data from DRAM array 12 at data bus 14 during read cycles.

A write register 34 receives data from data bus 14 during write register load cycles. Write register 34 supplies block write data to column decoder 26. A bit masking circuit 55 and a column masking circuit 56 receive mask data from data bus 14 as will be explained more fully below with reference to FIG. 2. Bit masking circuit 55 and column masking circuit 56 supply mask data to column decoder 26 through a decoder logic circuit 57.

VRAM 10 includes a serial access memory or SAM 36. SAM 36 is a single row of eight-bit memory registers, with columns corresponding to the columns of DRAM array 12. SAM 36, when appropriately activated, simultaneously transfers data between its memory registers and the memory registers of a row of DRAM array 12.

A SAM address counter 38 is associated with SAM 36 to generate sequential SAM column addresses. A SAM decoder 40 receives the generated addresses. SAM decoder 40 has a serial data bus 41 connected to produce and receive serial data signals SDQ1 through SDQ8. SAM decoder 40 is responsive to the sequential SAM column addresses from SAM address counter 38 to transfer data between the corresponding column of SAM 36 and serial data bus 41. A SAM address latch/buffer 42 receives a beginning SAM column address signal from address bus 16 and initializes SAM address counter 38 accordingly.

Various additional control circuits and signals initiate and synchronize VRAM operations. However, since this invention is concerned primarily with the block write functions of VRAM 10, and since VRAM circuits and operational details are well documented, they are not described further here. Reference may be made to the data sheets and specifications previously mentioned regarding VRAMs for a more detailed description of timing and control requirements, including control signal requirements for transferring data into SAM 36 from DRAM array 12 and for serially transferring such data out through SAM decoder 40.

FIG. 2 is provided to simplify the explanation of the selective block write function in VRAM 10. FIG. 2 is thus a conceptual diagram of the selective block write function, rather than a representation of physical elements within VRAM 10.

DRAM array 12 is shown as eight two-dimensional planes of memory cells. Together, the planes form rows and columns of eight-bit memory registers as already described. Individual memory cells are not shown, with the exception of an arbitrarily selected block of four consecutively-addressed memory cells 52 in each plane. Memory cells 52 are shown as an example of addressing during a selective block write cycle.

Write register 34 is an eight-bit static memory register. In a typical selective block write application, write register 34 is first initialized during a write register load cycle. Subsequently, data from write register 34 is written to blocks of memory registers within DRAM array 12, such as block 52, during block write cycles.

During a selective block write cycle, a row address and a column address are provided to VRAM 10 through multiplexed address bus 16. VRAM 10 latches the row address from A0 through A8 at the falling edge of RAS*, and the column address from A2 through A8 at the falling edge of CAS*, similar to a normal write cycle. A0 and A1 of the column address are disregarded during the selective block write cycle. The row address and column block address form a memory register base address which is the address of the first memory register of a block of four adjacent memory registers within a row. Memory cells 52 are shown in FIG. 2, in each of the logical planes of DRAM array 12, as an example of four adjacent memory registers within a row being simultaneously addressed for writing during a selective block write cycle.

Data is then written simultaneously from write register 34 to the block of adjacent memory registers through bit masking circuit 55 and column masking circuit 58. Data is not written from data bus 14.

Bit masking circuit 55 allows individual bits to be masked from writing so that a memory write may be performed on specified bits without altering the remaining bits. Bit masking circuit 55 contains a bit mask register 61 and eight corresponding bit enable gates 59. Bit mask register 61 is loaded with a bit mask code from data signals DQ1 through DQ8 during a bit mask register load cycle. Each bit of bit mask register 61 corresponds to a bit of write register 34. A bit value of zero indicates that the corresponding write register bit is to be masked. A bit value of one indicates that the corresponding write register bit is to be written to DRAM array 12.

Column or register masking circuit 56 allows specification of a column of register mask code. The column mask code is latched in a column mask register 60 from data signals DQ1 through DQ4 at the latter of WE* and CAS* going low during the selective block write cycle. Each bit of column mask register 60 corresponds to one of the four adjacent column locations. A bit value of zero indicates that the corresponding column is to be masked. A bit value of one indicates that the corresponding column is to be written from write register 34.

FIG. 3 a conceptual diagram of the flash block write function. A flash write is very similar to a block write, except that an entire row of memory registers is selected and written to simultaneously.

As in a selective block write cycle, write register 34 is first initialized during a write register load cycle. Subsequently, data from write register 34 is written to rows of memory registers within DRAM array 12.

Write register 34 provides an eight-bit data word during flash write cycles. The eight bits are routed through bit masking circuit 55 before being supplied to DRAM array 12. A row address is provided to VRAM 10 through multiplexed address bus 16. VRAM 10 latches the row address from A0 through A8 at the falling edge of RAS*. Memory register row 53 is shown in FIG. 3, in each of the logical planes of DRAM array 12, as an example of a register row being simultaneously addressed for writing during a flash write cycle.

Bit masking circuit 55 functions during a flash block write cycle as already described above to mask individual bits in each memory register from being written.

As a background, FIG. 4 illustrates the required sequence and relative timing of control signals to perform a normal write cycle to a single memory register within DRAM 12. DSF remains low throughout the entire write cycle. RAS* goes low to signal the presence of a valid row address signal at A0 through A8. ME*/WE* and CAS* go low to signal a valid column address at A0 through A8. At the latter of ME*/WE* and CAS* going low the data on DQ1 through DQ8 is written to the addressed memory register.

FIG. 5 illustrates the required sequence and relative timing of control signals to perform a write register load cycle, wherein write register 34 (FIGS. 1-3) is loaded from DQ1 through DQ8. The write register load cycle is similar to a normal write cycle, with address signals A0 through A8 being "don't cares," since there is no need to specify a memory address. DSF and ME*/WE* are both high as RAS* goes low to signal initiation of the write register load cycle. CAS* is lowered during the write register load cycle to indicate the presence of valid write register data at DQ1 through DQ8. DSF must remain high throughout the write register load cycle.

FIG. 6 illustrates the required sequence and relative timing of control signals to load bit mask register 61. This sequence is similar to a load write register cycle, except that DSF must be low when CAS* goes low. The bit mask register data is loaded from DQ1 through DQ8 at the falling edge of CAS*. Address signals A0 through A8 are "don't cares," since there is no need to specify a memory address. DSF and ME*/WE* are both high as RAS* goes low to signal initiation of the write register load cycle.

FIG. 7 illustrates the required sequence and relative timing of control signals to perform a selective block write cycle, wherein a block of four consecutively-addressed memory registers within a row of DRAM array 12 are simultaneously written with data from write register 34. As RAS* goes low, ME*/WE* is high and DSF is low to signal initiation of a selective block write cycle. DSF additionally must be high as CAS* goes low. RAS* going low also signals to VRAM 10 the presence of a valid row address at A0 through A8. ME*/WE* and CAS* are lowered to signal the presence of a valid column block address at A2 through A8. The contents of write register 34 are written to the addressed block of memory registers at the latter of CAS* and ME*/WE* to go low. A0 and A1 are ignored in forming the column block address during a selective block write cycle. A column mask code must be presented at DQ1 through DQ4 as CAS* goes low. DQ5 through DQ8 are unused during selective block write cycles.

FIG. 8 illustrates the required sequence and relative timing of control signals to perform a flash block write cycle in VRAM 10, wherein an entire row of memory registers within DRAM array 12 are simultaneously written with data from write register 34. As RAS* goes low, ME*/WE* is high and DSF is high to signal initiation of the flash write cycle. RAS* going low also signals to VRAM 10 the presence of a valid row address at A0 through A8. As ME*/WE* and CAS* are lowered, a column mask code is presented by data signals DQ1 through DQ4. Additionally, a column block address is presented by data signals A2 through A8 as ME*/WE* and CAS* go low. At the latter of CAS* and ME*/WE* to fall, data is written from the selected write register to the selected row of memory registers.

DRAMs and VRAMs typically incorporate, in addition to the block write functions, other functions which speed writing and reading of memory registers, such as a page writing and static column addressing. The invention described below, however, is concerned with providing an enhancement to block writing, wherein data may be written during a block write cycle from a selected one of several write registers. Such an enhancement speeds memory operations by eliminating the need to perform a write register load cycle when it is desired to change the value written during block write cycles. Data may be preloaded in a plurality of write registers and an individual write register selected during the block write cycle itself.

BRIEF DESCRIPTION OF THE DRAWINGS

A preferred embodiment of the invention is described below with reference to the accompanying drawings.

DETAILED DESCRIPTION OF THE PREFERRED EMBODIMENT

Figure 1:
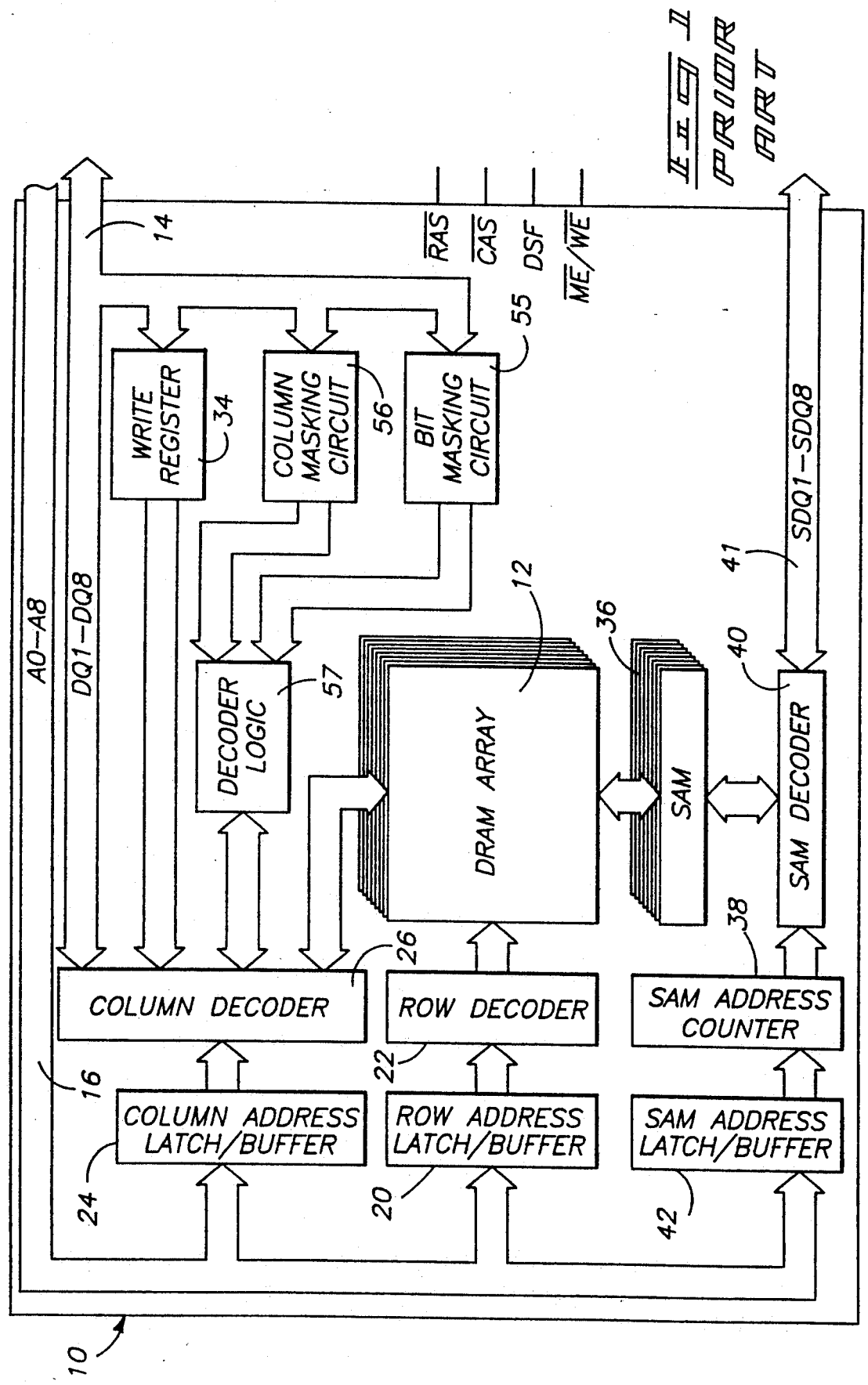
FIG. 1 is a simplified schematic block diagram of a prior art video random access memory circuit.
Figure 2:
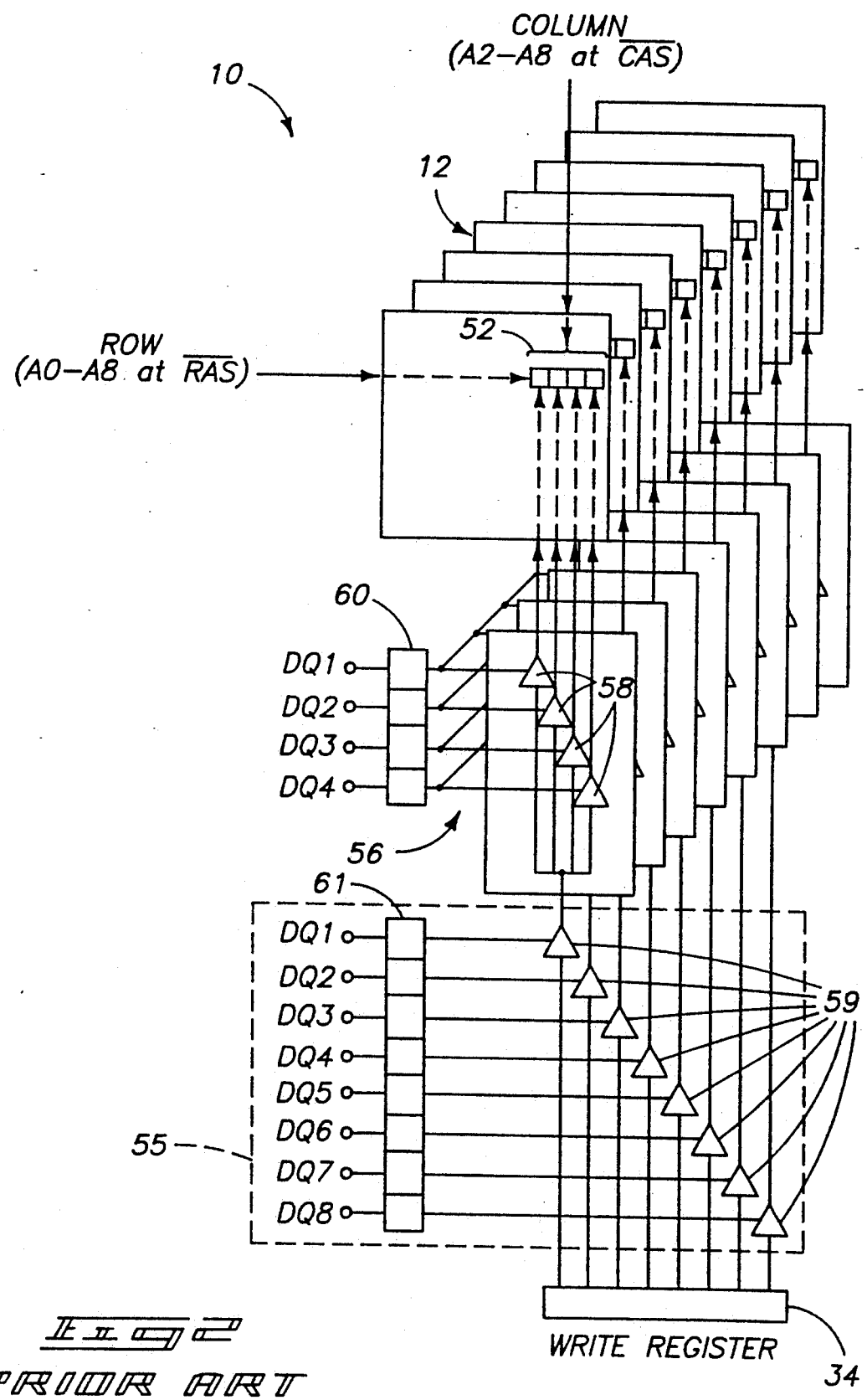
FIG. 2 is a schematic block diagram illustrating the selective block write function in the video random access memory circuit of FIG. 1.

This disclosure of the invention is submitted in furtherance of the constitutional purposes of the U.S. Patent Laws "to promote the progress of science and useful arts." U.S. Constitution, Article 1, Section 8.

Block writing is normally performed in random access memories as described above. Such memories generally comprise an array of randomly addressable memory registers, wherein blocks of said memory registers are selectable for parallel block writing from a write register. While prior art memories allow writing only from a single write register, this invention allows storing data in a plurality of individually addressable write registers and subsequently writing data from one of the write registers to the selected block of memory registers. Such a memory register block might comprise an arbitrary or predefined number of consecutive memory registers within a row or an entire row of memory registers.

Writing data from a write register to a selected block of memory registers is preferably performed by first addressing a single write register from among a plurality of write registers and also by addressing a predefined number of memory registers within the array to constitute the selected block of memory registers. The memory registers of the selected block preferably have consecutive addresses, thus being logically "adjacent" to each other. Alternatively, an entire row of memory registers can be selected as a block.

In a selective block write, a memory register block is typically specified by receiving a memory register base address. The block of memory registers is then determined to include the memory register having the memory register base address. The memory register base address is typically the address of the first memory register within the block, with four memory registers normally being included in each memory register block. The memory register base address preferably comprises a memory register row address and a column block address.

In a flash block write, an entire row of memory registers is specified by receiving a memory register row address.

A write register is preloaded during a write register load cycle by receiving a first write register address from a first signal bus, preferably an address bus, and by writing or storing data to a write register associated with or addressed by the first write register address. An address strobe signal is received to strobe the first write register address onto the first signal bus. Optionally, multiple address strobe signals are sequentially received during a write register load cycle to strobe sequential first write register addresses onto the first signal bus for loading multiple write registers. With respect to memories receiving row and column addresses through a multiplexed address bus, the address strobe signal preferably comprises a column address strobe signal. Alternatively, the address strobe signal may comprise a row address strobe signal.

Block writing occurs during block write cycles. During a block write cycle, a second write register address is received from a second signal bus, preferably a data bus. The second write register address specifies and is associated with a second write register. The second write register is addressed during the block write cycle. During a selective block write cycle data is written from the addressed second write register in parallel to the selected block of consecutively-addressed memory registers. During a flash block write cycle, the data is written in parallel to an entire row of memory registers.

A further aspect of this invention includes receiving a register mask code from a memory data bus during a block write cycle and masking individual memory registers within the selected block of memory registers from being written to during said block write cycle. A preferred method comprises receiving the mask code concurrently with receiving the second write register address, both the mask code and the second write register address being received from the memory data bus during a block write cycle.

Figure 9:
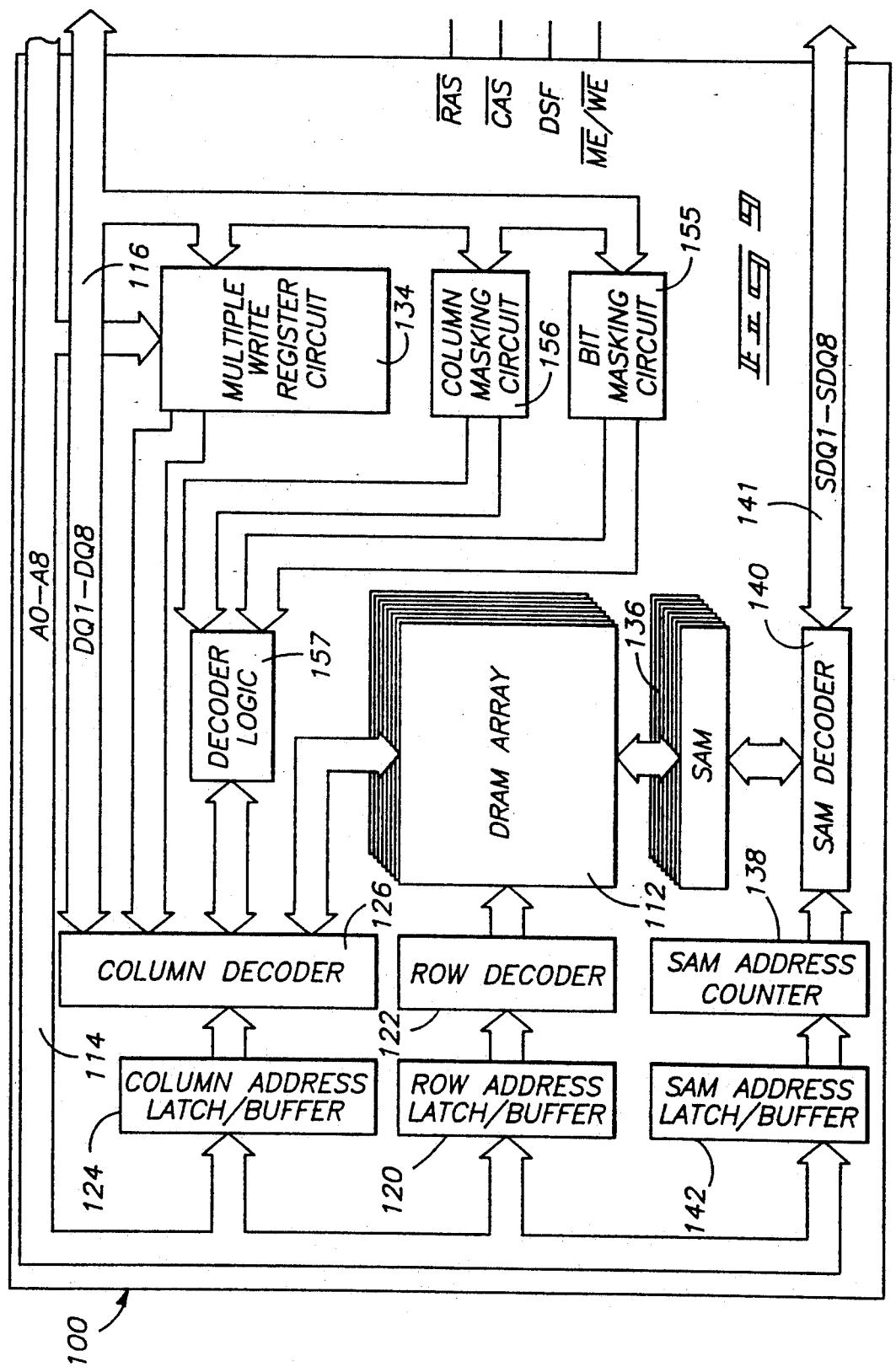
FIG. 9 is a simplified schematic block diagram of a video random access memory circuit according to this invention.

FIG. 9 is a simplified block diagram of a preferred embodiment of a video random access memory (VRAM) integrated circuit in accordance with this invention and which is generally designated by the reference numeral 100. While a VRAM is illustrated, the functions and methods described below are equally applicable to dynamic memories in general, and at least in part to other types of memory devices, such as static random access memories. As in the description of the prior art, circuits and signals not relating primarily to the block write functions of VRAM 100 are omitted to focus on the principal elements relating to the preferred embodiment. As previously mentioned, reference should be made to the available literature for more detailed information relating to DRAMs and VRAMs.

VRAM 100 comprises a DRAM array 112 having a plurality of memory registers, each memory register comprising at least one dynamic memory cell. More specifically, DRAM array 112 has rows and columns of eight-bit randomly addressable memory registers, as described above with reference to FIG. 1. VRAM 100 has a multiplexed address bus 114 which receives memory register row and column addresses that specify rows and columns of memory registers in DRAM array 112 for reading and writing. Address bus 114 receives individual address signals A0 through A8, which represent memory register row and column addresses, from an external source such as a microprocessor. VRAM 100 receives row and column address strobe signals RAS* and CAS* which strobe memory row and column register addresses, respectively, onto address bus 114 during memory register access cycles. RAS* and CAS* perform additional signalling functions as will become apparent. VRAM 100 also receives a mask enable/write enable signal ME*/WE* and a special function signal DSF.

VRAM 100 has a data bus 116 which receives memory register data for writing to memory registers during memory write cycles and which produces memory register data from memory registers during memory read cycles. Data bus 116 transfers individual data signals DQ1 through DQ8 between VRAM 100 and an external source such as a microprocessor.

A row address latch/buffer 120 and a row decoder 122 receive a row address signal from multiplexed address bus 114, decode a row address therefrom, and address or activate the corresponding row of DRAM array 112 for writing or reading. A column address latch/buffer 124 and a column decoder 126 receive a column address signal from multiplexed address bus 114, decode a column address therefrom, and address or activate the corresponding column of DRAM array 112. During block write cycles, column decoder 126 simultaneously addresses and writes to an entire addressed row of memory registers or to a consecutively-addressed block of four memory registers within an addressed row.

VRAM 100 also has a multiple write register circuit 134 which includes a plurality of individual write registers. Multiple write register circuit 134 receives write register data from data bus 116. It also supplies block write data from a selected write register to column decoder 126. Such block write data is for writing to multiple memory locations in DRAM array 112 during block write cycles. Multiple write register circuit 134 also receives address signals A0 through A3 from address bus 114.

A bit masking circuit 155 and a register or column masking circuit 156 receive mask data from data bus 116. Such mask data is supplied to column decoder 126 through a decoder logic circuit 157.

VRAM 100 has timing and control circuitry (not shown) to generate appropriate control signals for initiating and performing memory access cycles such as memory register block write cycles. A block write cycle is a memory register access cycle in which a row or a predefined number of consecutively-addressed memory registers within a row is simultaneously written to as a block from a selected write register.

During selective block write cycles, column decoder 126 is responsive to a column or memory register base address received by address bus 114 to simultaneously address or select a predefined number of columns within DRAM array 112. Memory registers within the addressed columns and within a row addressed by row decoder 122 form the block of memory registers which are written to in parallel during the selective block write cycle.

Multiple write register circuit 134 is responsive during selective block write cycles to a memory register base address to simultaneously address a number of consecutive memory registers within a row. The memory register base address comprises a column address received by address bus 114. However, only address signals A2 through A8 are considered, A0 and A1 being ignored. The memory register base address thus represents the starting address of block of four memory registers to be written to during a selective block write cycle.

During a flash block write cycle, column decoder 126 and write register circuit 134 are responsive to a single row address received by address bus 114. This entire row is written to in parallel during a flash block write cycle.

The timing and control circuitry of VRAM 100 also generates control signals for initiating and performing write register load cycles. A write register load cycle is a memory cycle in which a selected write register of multiple write register circuit 134 is loaded from data bus 116. It is very similar to a normal memory register write cycle.

VRAM 100 includes a serial access memory or SAM 136. SAM 136 is a single row of eight-bit memory registers, with columns corresponding to the columns of DRAM array 112. When appropriately activated, SAM 136 simultaneously transfers data between the memory registers of a row of DRAM array 112 and corresponding SAM memory registers.

A SAM address counter 138 is associated with SAM 136 to generate sequential SAM column addresses. A SAM decoder 140 receives these addresses. SAM decoder 140 has a serial data bus 141 connected to produce and receive serial data signals SDQ1 through SDQ8. SAM decoder 140 is responsive to the sequential SAM column addresses from SAM address counter 138 to transfer data between the corresponding column of SAM 136 and serial data bus 141. A SAM address latch/buffer 142 receives a beginning SAM column address signal from address bus 114 and initializes SAM address counter 138 accordingly.

Various additional control circuits and signals initiate and synchronize VRAM operations. However, as mentioned in the description of the prior art, this invention is concerned primarily with the block write functions of VRAM 100. Reference may be made to the data sheets and specifications previously mentioned as well as other widely available sources regarding VRAMs for a more detailed description of timing and control requirements.

Figure 10:
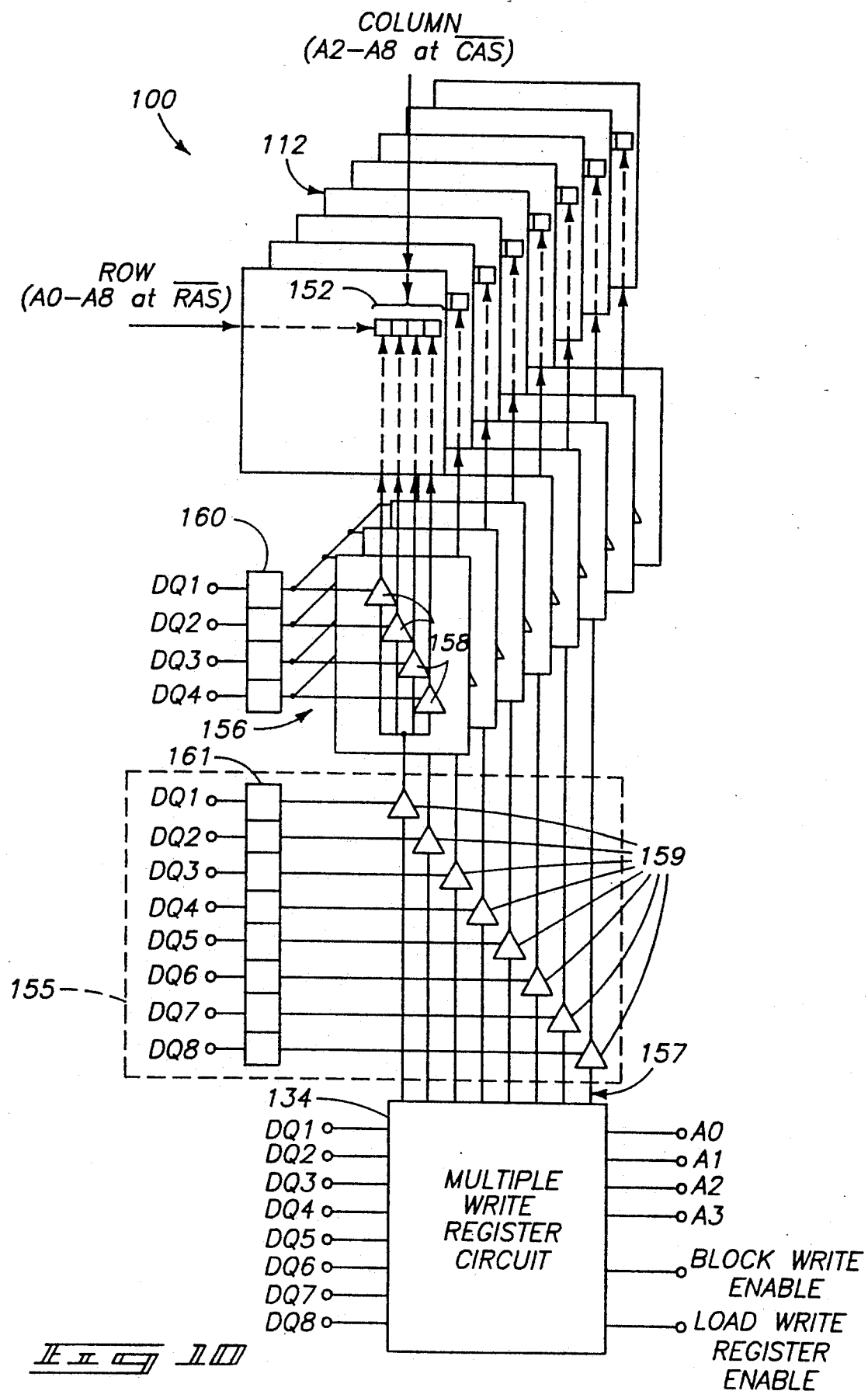
FIG. 10 is a schematic block diagram illustrating the selective block write function in the video random access memory circuit of FIG. 9.

FIG. 10 provides a simplified conceptual representation of the selective block write function in VRAM 100. DRAM array 112 is shown as eight planes of two-dimensional memory cells forming rows and columns of eight-bit memory registers. An arbitrarily selected block of four consecutively-addressed memory cells 152 in each plane is shown as an example of addressing during a selective block write cycle.

Multiple write register circuit 134 includes a plurality of eight-bit static memory registers or write registers. Multiple write register circuit 134 is responsive to a block write enable signal and a load write register enable signal, both of which may be generated either by multiple write register circuit 134 itself or by other timing and control circuits (not shown) within VRAM 100. Multiple write register circuit 134 also receives data signals DQ1 through DQ8 and address signals A0 through A3, and produces eight write register outputs signals 157.

An eight-bit data word is provided from multiple write register circuit 134 during selective block write cycles. The eight bits are routed through bit masking circuit 155 and then through column masking circuit 156 before being supplied to DRAM array 112.

Bit masking circuit 155 allows individual bits to be masked from writing so that a memory write may be performed on specified bits in each selected column without altering the remaining bits. Bit masking circuit 155 contains a bit mask register 161 and eight corresponding bit enable gates 159. Bit mask register 161 is loaded with a bit mask code from data signals DQ1 through DQ8 during a bit mask register load cycle. Each bit of bit mask register 161 corresponds to a bit of multiple write register 134. A bit value of zero indicates that the corresponding write register bit is to be masked. A bit value of one indicates that the corresponding write register bit is to be written to DRAM array 112.

Column or register masking circuit 156 receives write register output signals 157 after they have been masked by bit masking circuit 155. The eight signals are routed through eight sets of four write enable gates 158 to four adjacent columns of DRAM array 112. A four-bit register or column mask register 160 controls write enable gates 158. Column mask register 160 is loaded with a four-bit register or column mask code received from data signals DQ1 through DQ4 by data bus 116 at the latter falling edge of CAS* and ME*/WE* during selective block write cycles. Each bit of column mask register 160 corresponds to one of the four adjacent column locations. A bit value of zero indicates that the corresponding column is to be masked. A bit value of one indicates that the corresponding column is to be written to from multiple write register circuit 134. Masking circuit 156 is therefore responsive to the column mask code during a selective block write cycle to mask individual columns of memory registers within the addressed block of registers from being written to.

Figure 11:
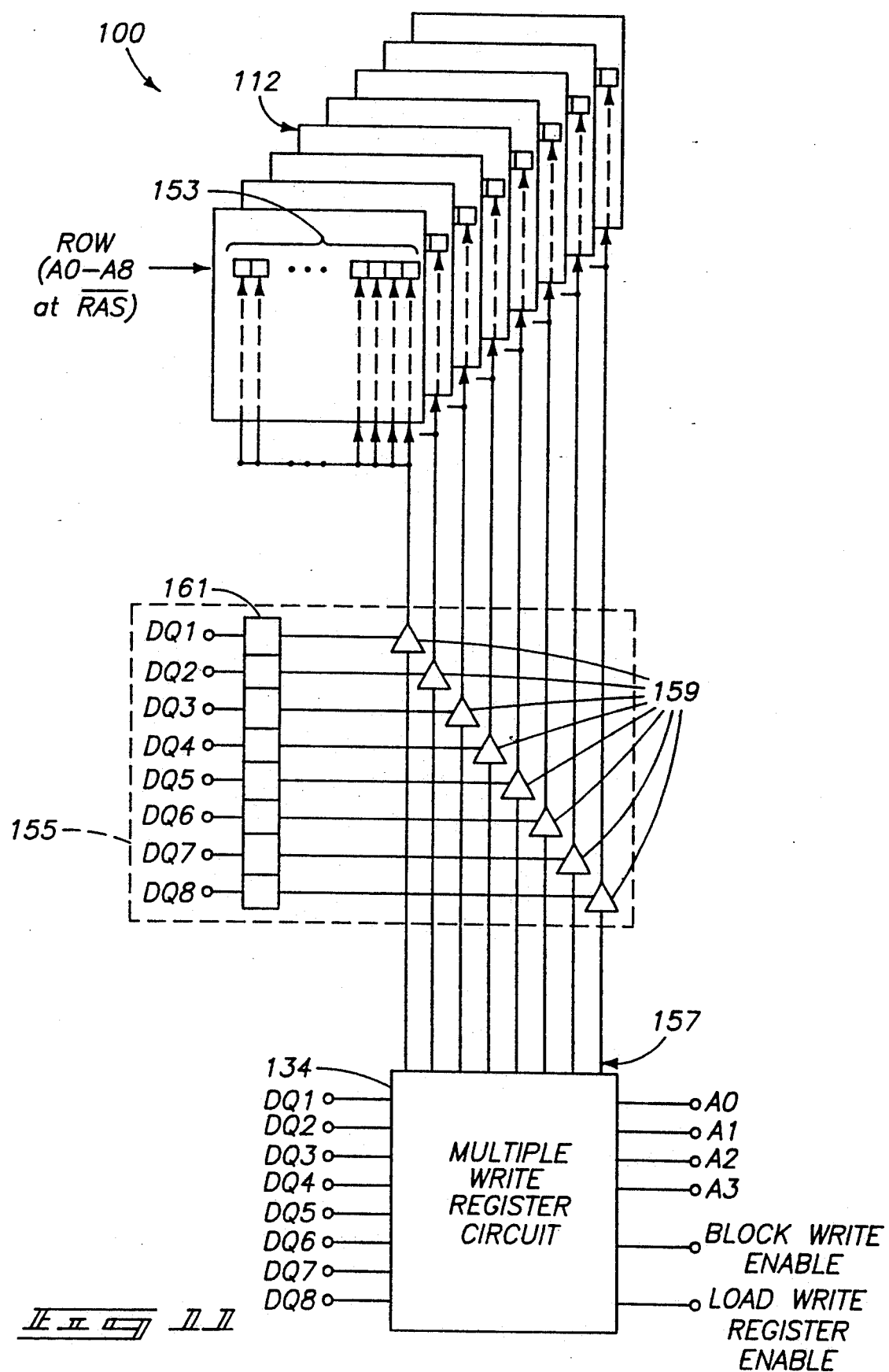
FIG. 11 is a schematic block diagram illustrating the flash block write function in the video random access memory circuit of FIG. 9.

FIG. 11 is a conceptual diagram of the flash block write function. A flash block write is very similar to a selective block write, except that an entire row of memory registers is selected and written simultaneously.

As in a selective block write cycle, write register circuit 134 is initialized in one or more write register load cycles. Subsequently, data from write register 134 is written to rows of memory registers within DRAM array 112 during flash block write cycles.

Figure 3:
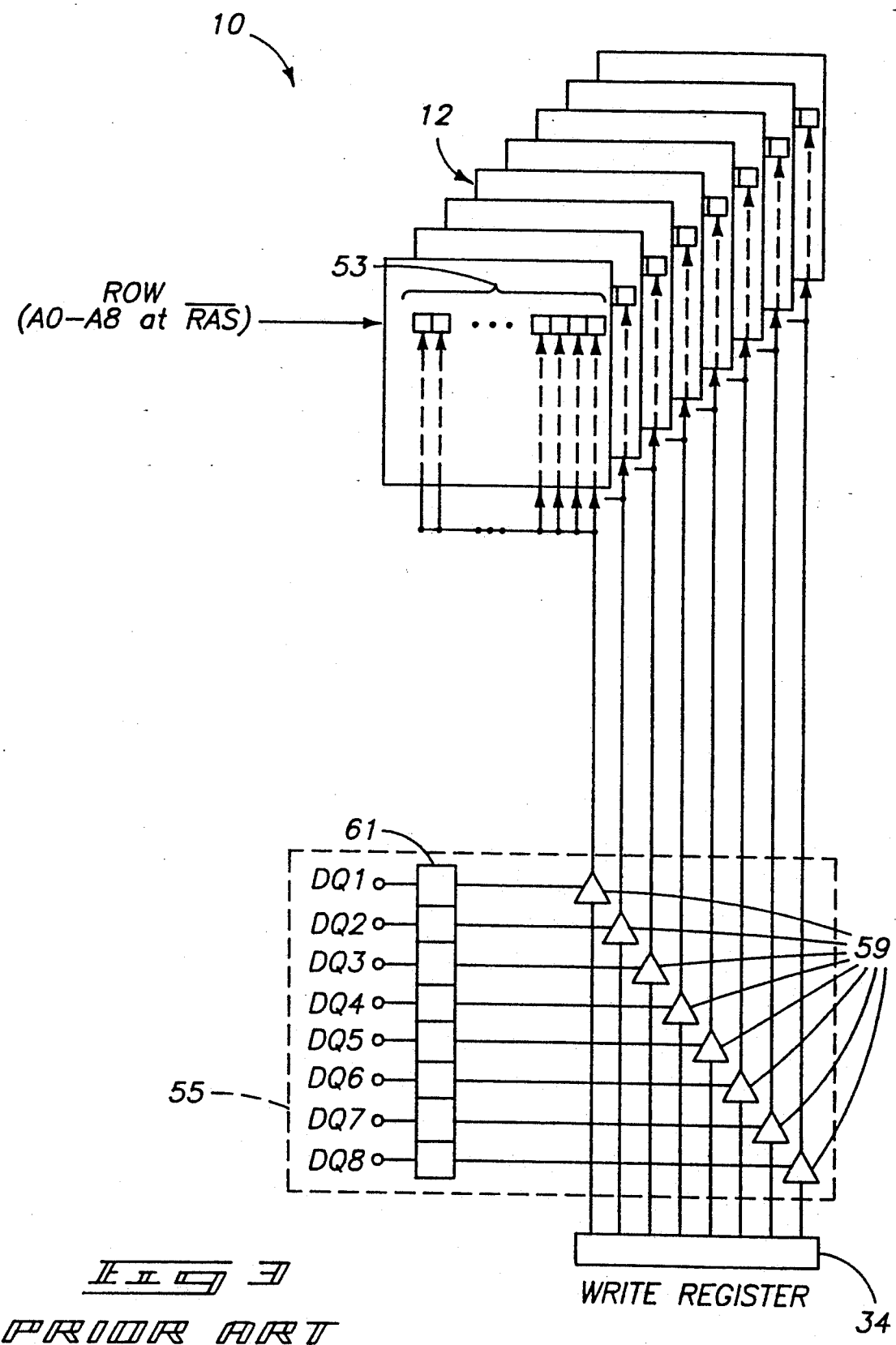
FIG. 3 is a schematic block diagram illustrating the flash block write function in the video random access memory circuit of FIG. 1.
Figure 4:
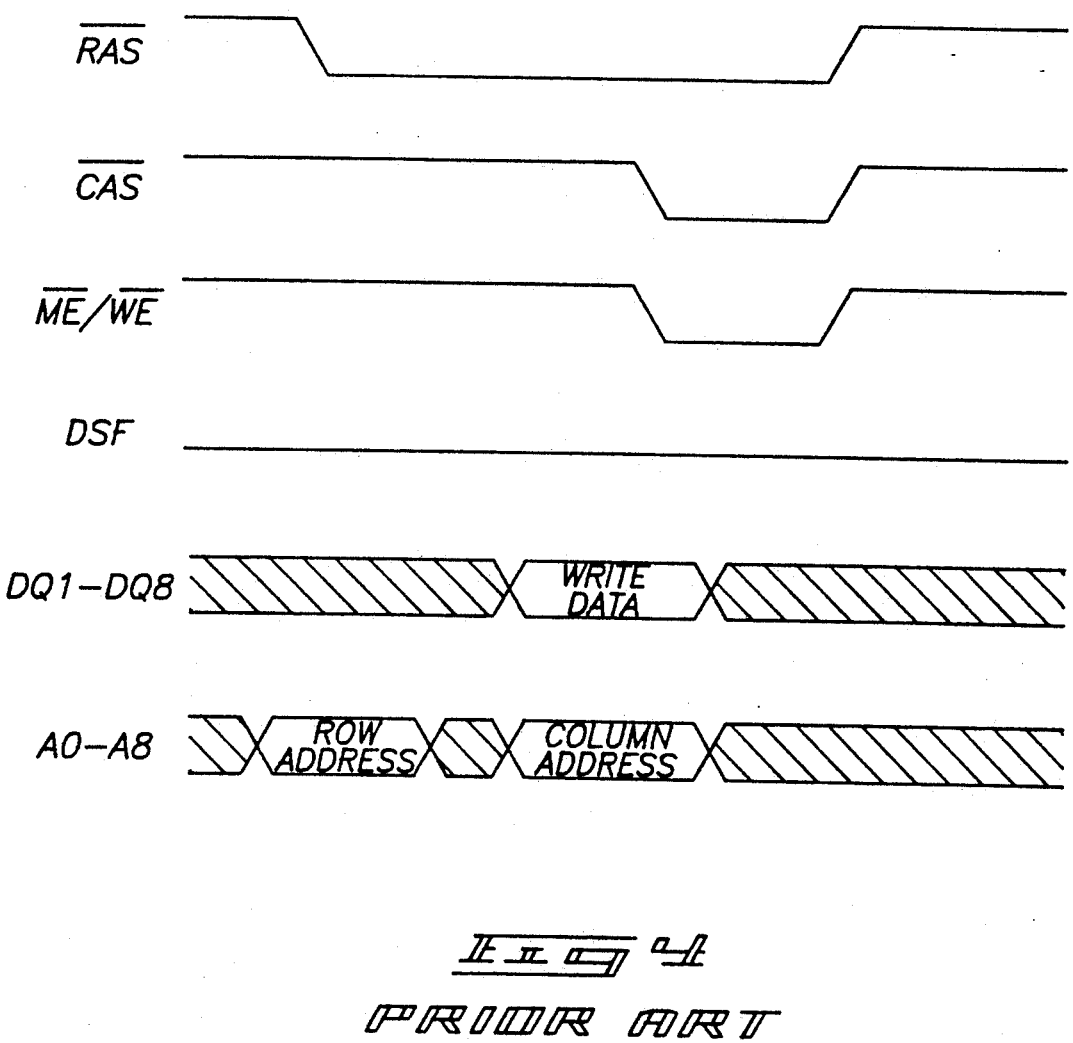
FIG. 4 is a timing diagram showing normal write cycle signals from the circuit of FIG. 1.
Figure 5:
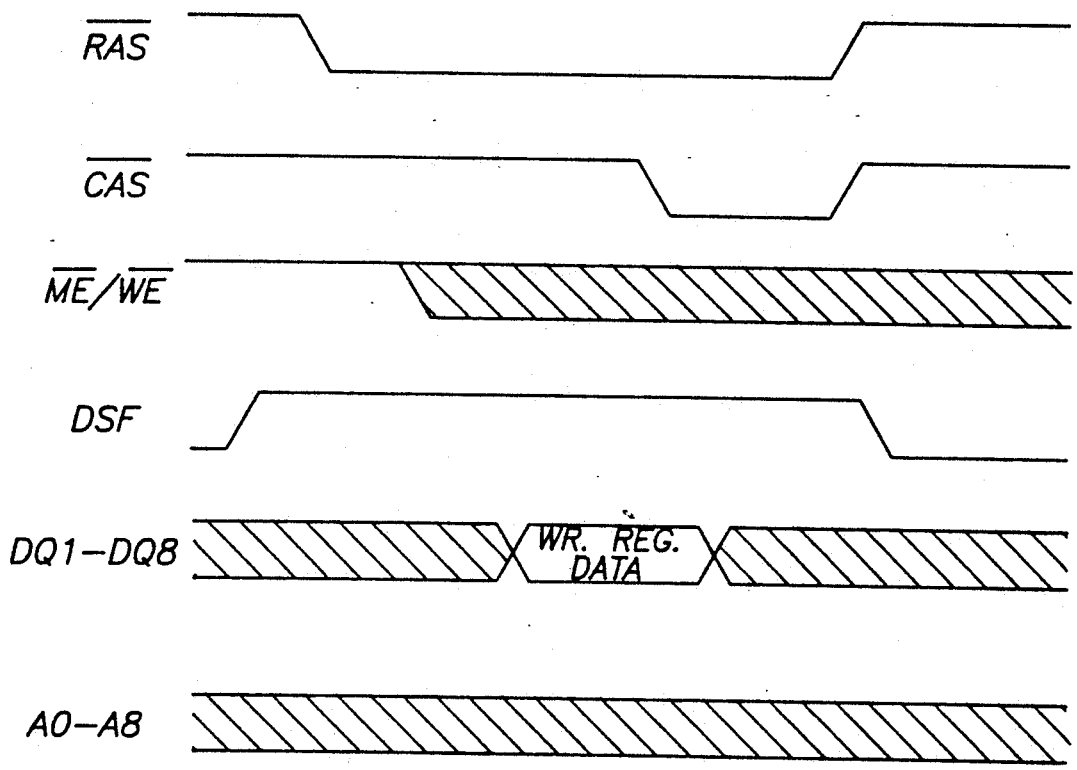
FIG. 5 is a timing diagram showing write register load cycle signals from the circuit of FIG. 1.

Write register circuit 134 provides an eight-bit data word during flash block write cycles. The eight bits are routed through bit masking circuit 155 before being supplied to DRAM array 112. Memory register row 153 is shown in FIG. 3, in each of the logical planes of DRAM array 112, as an example of a row of memory registers being simultaneously addressed for writing during a flash block write cycle. Bit masking circuit 155 functions as already described above with reference to FIG. 10.

Figure 12:
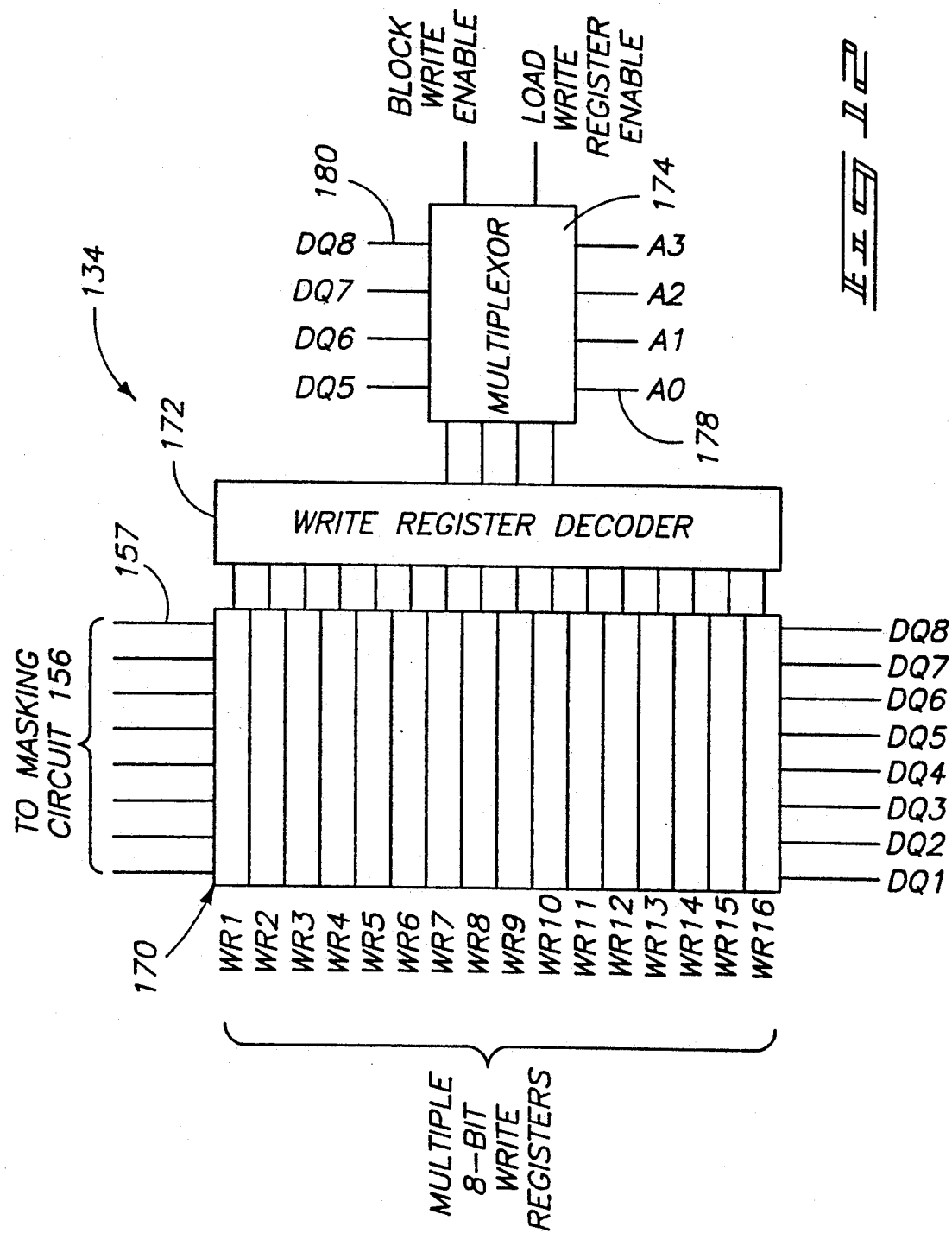
FIG. 12 is a schematic block diagram of the multiple write register circuit of FIGS. 9-11.

FIG. 12 is a more detailed block diagram of multiple write register circuit 134. Circuit 134 comprises a plurality of individually addressable write registers 170, a write register decoder 172, and an address multiplexer 174. Multiple write register circuit 134, in the embodiment shown, has sixteen consecutively-addressed write registers 170, designated in FIG. 12 as WR1 through WR16. Write registers 170 preferably comprise static memory cells which correspond in width to the memory registers of DRAM array 112, thus being eight bits wide in the preferred embodiment.

Write registers 170 are connected to data bus 116 to receive data signals DQ1 through DQ8. Write registers 170 generate the eight write register output signals 157. Multiple write register circuit 134 provides data from an addressed write register to the selected row or block of memory registers through output signals 157 during block write cycles.

Write register decoder 172 receives a four-bit write register address signal from address multiplexer 174 during both block write cycles and write register load cycles. Decoder 172 responds to the write register address signal during block write cycles to address a single write register 170 from which the addressed row or the predefined number of memory registers are written in parallel. Decoder 172 responds to the write register signal during write register load cycles to address a single write register to be loaded or initialized.

Address multiplexer 174 has first and second address inputs, generally designated by the reference numerals 178 and 180. First address input 178 is connected to address bus 114 to receive address signals A0 through A3. Second address input 180 is connected to data bus 116 to receive data signals DQ5 through DQ8. Multiplexer 174 also receives the block write enable signal and the load write register enable signal. During write register load cycles, the load write register enable signal is active, thereby signalling address multiplexer 174 to supply A0 through A3 to write register decoder 172. During block write cycles, the block write enable signal is active, thereby signalling address multiplexer 174 to supply D5 through D8 to write register decoder 172.

More specifically, during a write register load cycle column address strobe signal CAS* strobes a first write register address onto address bus 114. First address input 178 receives the first write register address from A0 through A3. Write register decoder 172 in response to said first write register address addresses a first write register for loading. Multiple write registers may be sequentially loaded during a write register load cycle by successively strobing a plurality of first write register addresses onto address bus 114 by repeated column address strobe signals CAS*.

During a block write cycle CAS* and ME*/WE* strobe a second write register address onto DQ5 through DQ8 of data bus 116. Second address input 180 receives the second write register address and in response addresses a second write register. Data from the addressed second write register is written in parallel to the selected block of memory registers during said block write cycle.

In operation, write registers 170 are first loaded during one or more write register load cycles with values which are to be written to blocks of memory registers. Address signals A0 through A3, unused during write register load cycles of prior art circuits, are used in VRAM 100 during write register load cycles to select a single write register from the sixteen write registers 170 for loading. After loading write registers 170, block write cycles are performed to write from selected write registers of multiple write register circuit 134 to DRAM array 112.

Address signals A0 through A3 are unavailable to specify a write register address during block write cycles, being used to specify DRAM row and column addresses for the block write. Data signals DQ1 through DQ4 are also unavailable, at least during selective block write cycles, being used to specify a column mask code as already described. However, data signals DQ5 through DQ8 are unused during both types of block write cycles in prior art circuits. Accordingly, data signals D5 through D8 are used in VRAM 100 during block write cycles to select a single write register of the sixteen write registers 170 from which data is written. A write register address is supplied at DQ5 through DQ8 concurrently with the mask code being presented at DQ1 through DQ4.

Figure 13:
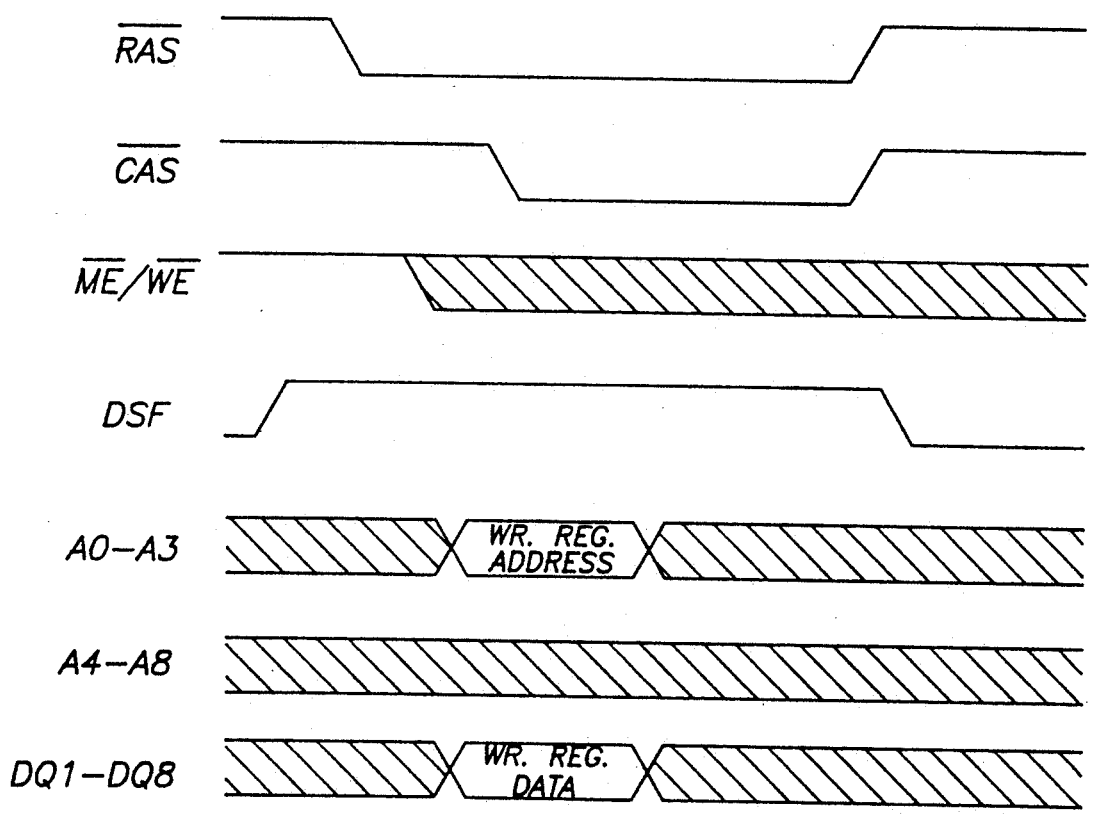
FIG. 13 is a timing diagram showing write register load cycle signals from the circuit of FIG. 9.

A write register load cycle is performed similarly to a normal write cycle in a prior art VRAM or DRAM, and also similarly to write register load cycles in prior art VRAMs. FIG. 13 shows the necessary sequence and relative timing of control signals for a write register load cycle. DSF and ME*/WE* are high as RAS* goes low to initiate the write register load cycle. DSF must remain high for the entire write register load cycle, while ME*/WE* becomes a "don't care," after RAS* falls. CAS* subsequently goes low, indicating the presentation of a valid write register address by address signals A0 through A3 and presentation of valid write register data by data signals DQ1 through DQ8.

Figure 14:
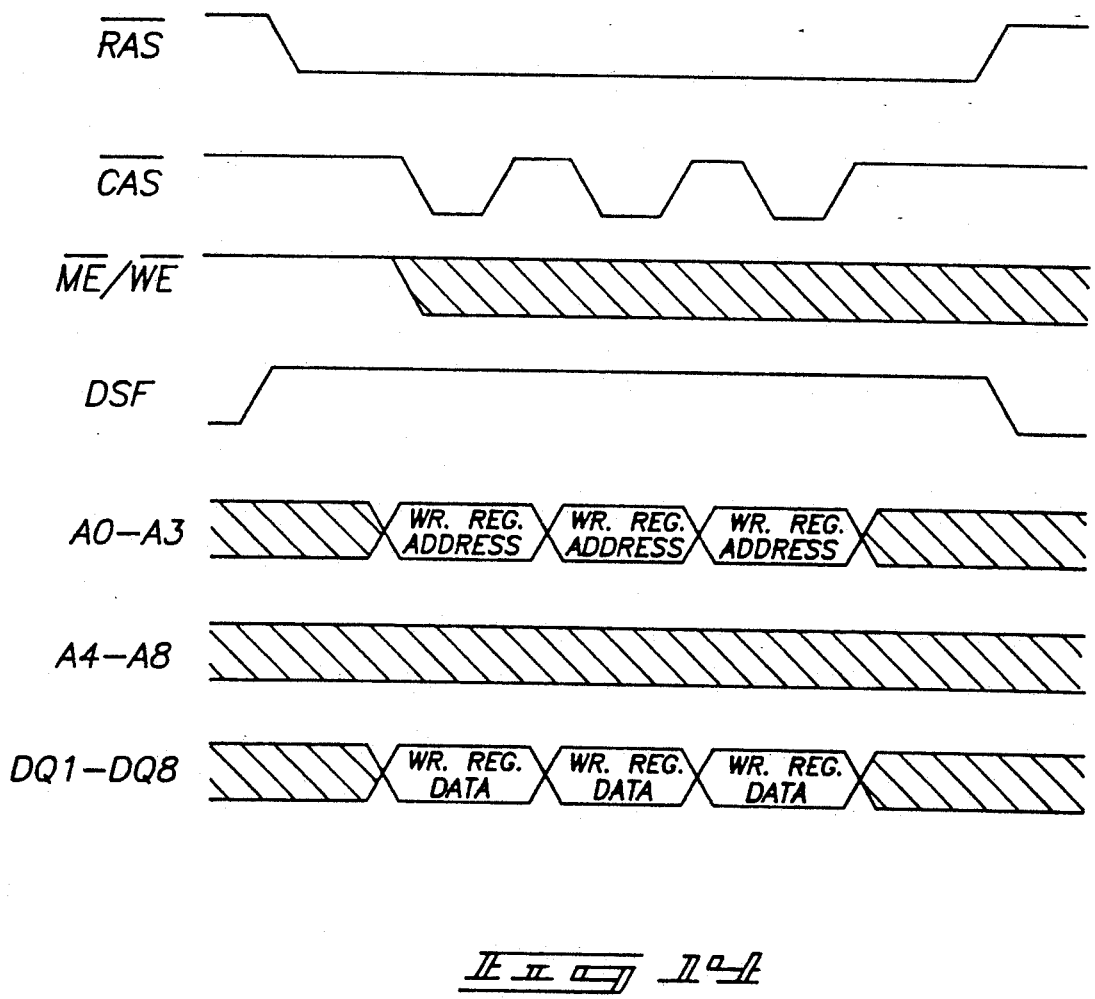
FIG. 14 is a timing diagram showing page mode write register load cycle signals from the circuit of FIG. 9.

Data may be written to multiple write registers 170 in a "page mode" write register load cycle, illustrated by FIG. 14. Page mode write register load cycles are similar to normal write register load cycles, described with reference to FIG. 13, except that CAS* is cycled, with each high-to-low transition signalling a new write register address and corresponding write register data.

Figure 6:
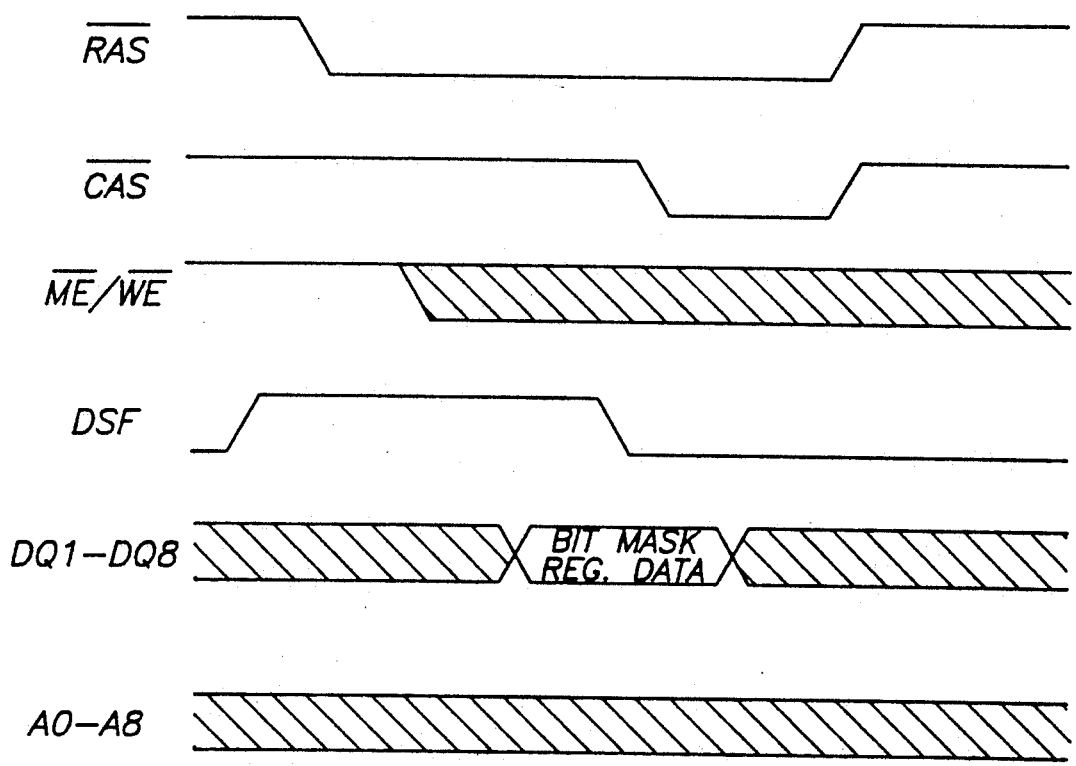
FIG. 6 is a timing diagram showing bit mask register load cycle signals from the circuit of FIG. 1.
Figure 7:
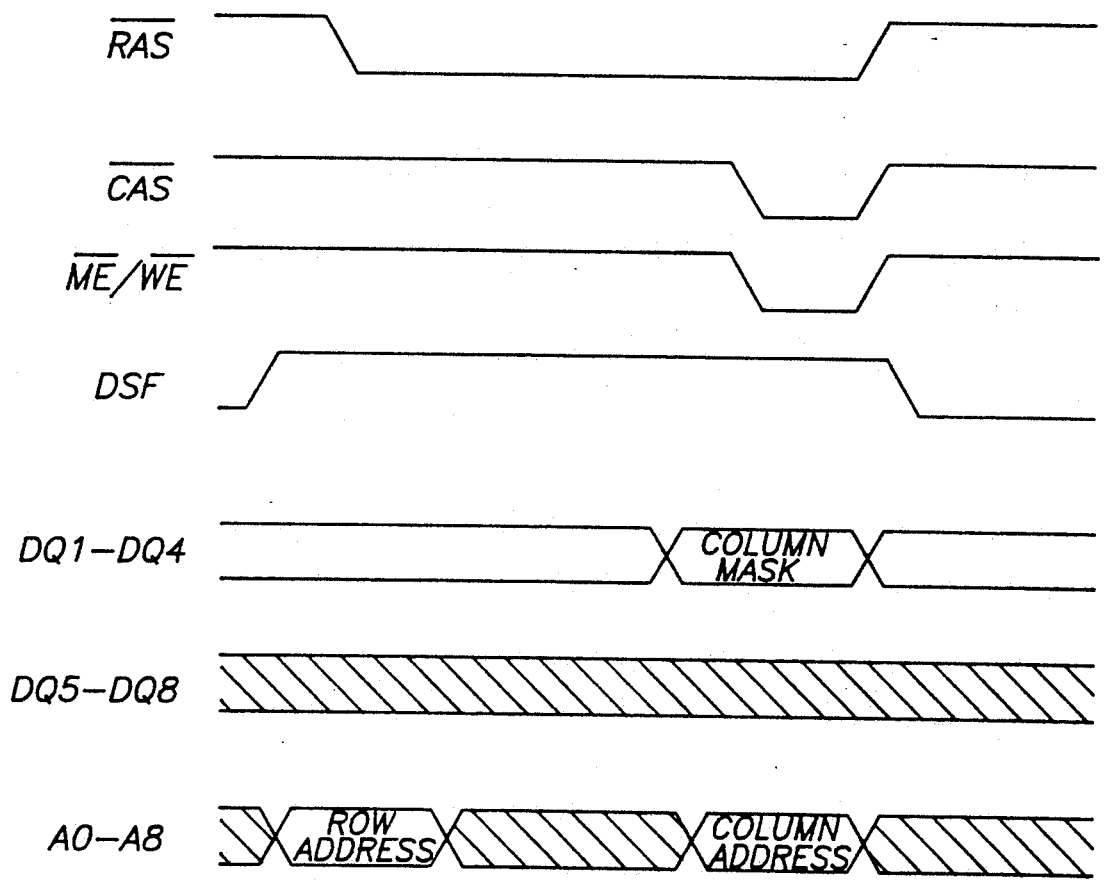
FIG. 7 is a timing diagram showing selective block write cycle signals from the circuit of FIG. 1.
Figure 8:
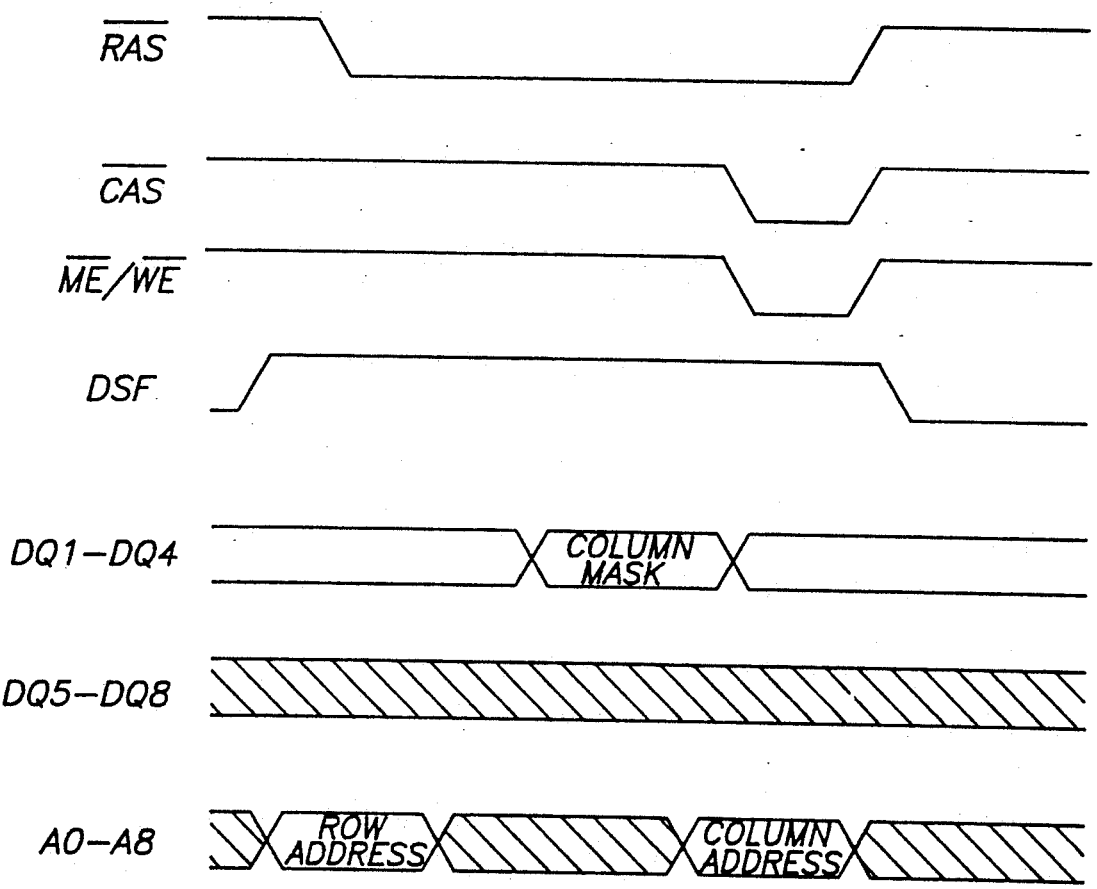
FIG. 8 is a timing diagram showing flash block write cycle signals from the circuit of FIG. 1.

Bit mask register 157 is loaded as in the prior art circuit described above, discussed particularly with reference to FIG. 6.

During a selective block write cycle, a row address and a column address are provided to VRAM 10 through multiplexed address bus 114. A row address is latched from A0 through A8 at the falling edge of RAS*, and a column address is latched from A2 through A8 at the falling edge of CAS*, similar to a normal write cycle. A0 and A1, however, are disregarded during specification of the column address in a block write cycle. The row address and column block address form a memory register base address which specifies the first of a block of four adjacent memory registers.

Data is then written simultaneously from a selected write register 170 to the block of adjacent memory registers through bit masking circuit 155 and register masking circuit 156. Data signals DQ1 through DQ4 are used during a block write cycle to specify a column mask code for masking circuit 156. Additionally, data signals DQ5 through DQ8 are used to specify one of the sixteen write registers 170 from which data is written.

The register mask code is latched in column mask register 160 at the latter of ME*/WE* and CAS* going low during the block write cycle. The falling of ME*/WE* and CAS* also signals presentation of a valid write register address by data signals DQ5 through DQ8.

A flash block write cycle is identical to a selective block write cycle except that no column address is specified and a column mask code is not supplied.

Figure 15:
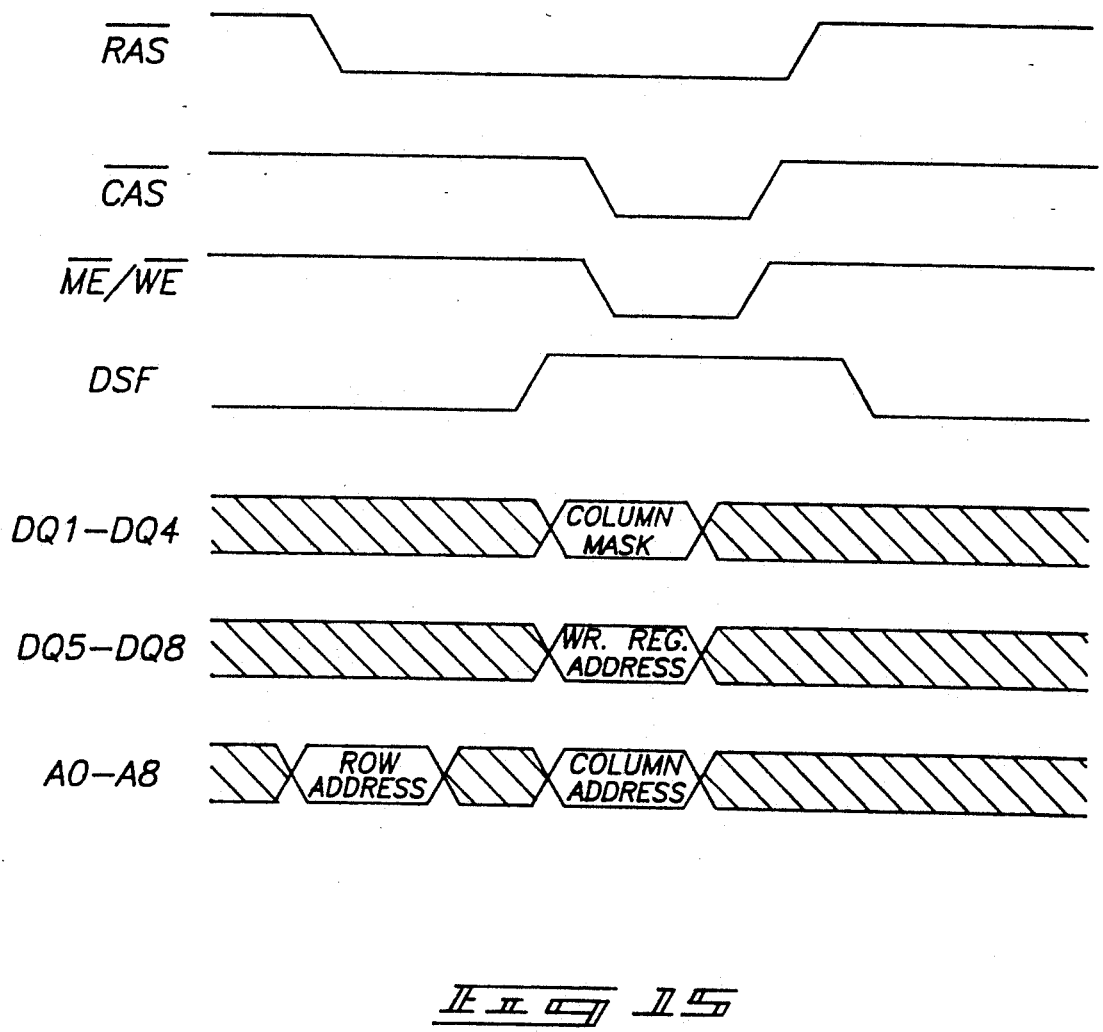
FIG. 15 is a timing diagram showing selective block write cycle signals from the circuit of FIG. 9.

FIG. 15 illustrates the required sequence and relative timing of control signals to perform a selective block write cycle in VRAM 100, wherein a block of four consecutively addressed memory registers within a row of DRAM array 112 are simultaneously written with data from a selected write register 170. As RAS* goes low, ME*/WE* is high and DSF is low to signal initiation of the block write cycle. DSF additionally must be high as CAS* subsequently goes low. RAS* going low also signals to VRAM 100 the presence of a valid row address at A0 through A8. As ME*/WE* and CAS* are lowered, a column mask code is presented by data signals DQ1 through DQ4, and a write register address is presented by data signals DQ5 through DQ8. Additionally, a column block address is presented by data signals A2 through A8 as CAS* goes low. At the latter of CAS* and ME*/WE* to fall, data is written from the selected write register to the selected block of memory registers.

Figure 16:
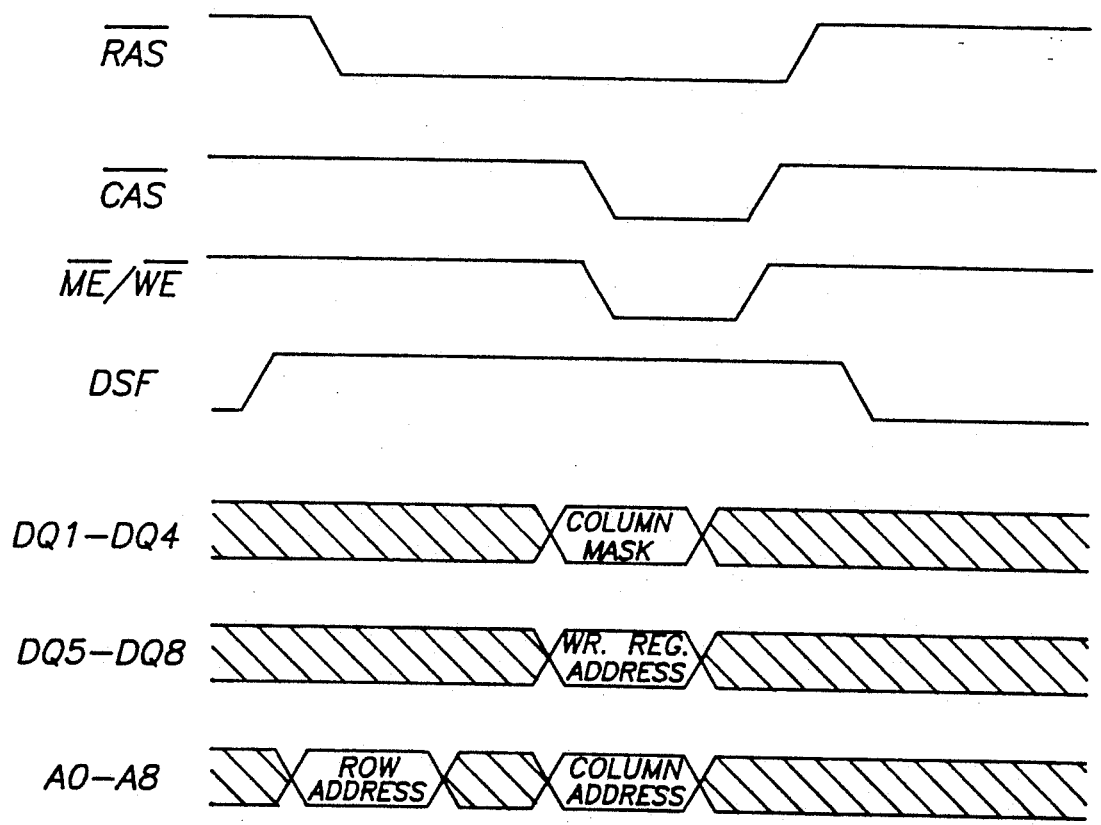
FIG. 16 is a timing diagram showing flash block write cycle signals from the circuit of FIG. 9.

FIG. 16 illustrates the required sequence and relative timing of control signals to perform a flash block write cycle in VRAM 100, wherein an entire row of memory registers within DRAM array 112 is simultaneously written with data from a selected write register 170. As RAS* goes low, ME*/WE* is high and DSF is high to signal initiation of the flash block write cycle. RAS* going low also signals to VRAM 100 the presence of a valid row address at A0 through A8. As ME*/WE* and CAS* are lowered, a column mask code is presented by data signals DQ1 through DQ4, and a write register address is presented by data signals DQ5 through DQ8. Additionally, a column block address is presented by data signals A2 through A8 as CAS* goes low. At the latter of CAS* and ME*/WE* to fall, data is written from the selected write register to the selected row of memory registers.

The multiple write register circuit described above enhances VRAM operation by allowing a block write cycle to be performed from one of a plurality of write registers, rather than from the single write register of the prior art. This enhancement speeds memory operations by eliminating the need to repeat write register load cycles every time a new value is written to a block of memory registers. Instead, the plurality of write registers is preloaded with written data, and a single write register is then selected during the block write to be written to the block of memory registers.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. In a memory device having an array of randomly addressable memory registers, blocks of said memory registers being selectable for block writing from a register during a block write cycle, a multiple write register circuit comprising:
    a plurality of write registers, each of the write registers being selectively connectable for writing to at least a common one of said selected blocks of said memory registers; and
    a write register decoder connected to the plurality of write registers to address a selected one of the write registers from which a selected block of memory registers is written during a block write cycle.

2. In the memory device as defined in claim 1 wherein the multiple write register circuit further comprises an address input which receives a write register address during a write register load cycle with the write register decoder responding to the write register address during said write register load cycle to address the selected write register for loading.

3. In the memory device as defined in claim 1 wherein the multiple write register circuit further comprises an address input which receives a write register address during a block write cycle with the write register decoder responding to the write register address during said block write cycle to address the selected write register and to write data from the selected write register to the selected block of memory registers in parallel during said block write cycle.

4. In a memory device having an array of randomly addressable memory registers, blocks of said memory registers being selectable for block writing from a register during a block write cycle, a multiple write register circuit comprising:
    a plurality of write registers;
    a write register decoder connected to the plurality of write registers to address a selected one of the write registers from which a selected block of memory registers is written during a block write cycle; and
    first and second address inputs in which the write register decoder is responsive to the first address input during a write register load cycle to address a first write register for loading data to the first write register and wherein the write register decoder is responsive to the second address input during a block write cycle to address a second write register from which data is written in parallel to the selected block of memory registers.

5. A random access memory integrated circuit comprising:
    a plurality of memory registers, each memory register comprising at least one memory cell, blocks of said memory registers being selectable for block writing;
    an address bus which receives memory register addresses that specify memory registers for reading and writing;
    a data bus which receives memory register data for writing to memory registers; and
    a multiple write register circuit having a plurality of individually addressable write registers, each of the write registers being selectively connectable for writing to at least a common one of the selectable blocks of memory registers, the multiple write register circuit writing data from an addressed write register in parallel to a selected block of memory registers during a block write cycle.

6. The random access memory integrated circuit of claim 5 wherein the multiple write register circuit comprises a write register decoder which is responsive to a write register address received from the address bus during a write register load cycle to address a write register for loading during said write register load cycle.

7. The random access memory integrated circuit of claim 5 wherein the multiple write register circuit comprises a write register decoder which is responsive to a first write register address received from the address bus during a write register load cycle to address a first write register for loading during said write register load cycle; the write register decoder being responsive to a second write register address received from the data bus during a block write cycle to address a second write register; the multiple write register circuit writing data from the second write register to the selected block of memory registers during said block write cycle.

8. The random access memory integrated circuit of claim 5 wherein said random access memory integrated circuit receives an address strobe signal that strobes memory register addresses onto the address bus during memory register access cycles; the address strobe signal strobing write register addresses onto the address bus during write register load cycles, wherein said write register addresses specify write registers to be loaded during said write register load cycles.

9. The random access memory integrated circuit of claim 5 wherein:
    said random access memory integrated circuit receives an address strobe signal that strobes memory register addresses onto the address bus during memory register access cycles;
    the address strobe signal strobes write register addresses onto the address bus during write register load cycles, wherein said write register addresses specify write registers to be loaded during said write register load cycles; and
    the multiple write register circuit comprises a write register decoder which is responsive to a plurality of write register addresses successively strobed onto the address bus by the address strobe signal during a write register load cycle to successively address a plurality of write registers for loading.

10. The random access memory integrated circuit of claim 5 further comprising a bit masking circuit to mask individual memory registers within the selected block of memory registers from being written to during a block write cycle.

11. The random access memory integrated circuit of claim 5 further comprising a register masking circuit which is responsive to a register mask code received from the data bus during a block write cycle to mask individual memory registers within the selected block of memory registers from being written to during said block write cycle.

12. The random access memory integrated circuit of claim 5 further comprising a bit masking circuit which is responsive to a bit mask code to mask bits of memory registers within the selected block of memory registers from being written to during said block write cycle.

13. The random access memory integrated circuit of claim 5 wherein:
    the multiple write register circuit comprises a write register decoder which is responsive to a write register address received from the data bus during a block write cycle to address a write register; the multiple write register circuit providing data from the addressed write register to the selected block of memory registers during said block write cycle; and
    the random access memory integrated circuit further comprises a register masking circuit which is responsive to a register mask code received from the data bus during said block write cycle to mask individual memory registers within the selected block of memory registers from being written to during said block write cycle.

14. The random access memory integrated circuit of claim 5 wherein:
    the multiple write register circuit comprises a write register decoder which is responsive to a write register address to address a write register; the multiple write register circuit providing data from the addressed write register to the selected block of memory registers during a block write cycle;
    the random access memory integrated circuit further comprises a register masking circuit which is responsive to a mask code to register mask individual memory registers within the selected block of memory registers from being written to during said block write cycle; and
    the write register address and the register mask code are concurrently received from the data bus during said block write cycle.

15. A random access memory integrated circuit comprising:
    a plurality of memory registers, each memory register comprising at least one memory cell;
    an address bus which receives memory register addresses that specify memory registers for reading and writing;
    a data bus which receives memory register data for writing to memory registers; and
    a multiple write register circuit having a plurality of individually addressable write registers, the multiple write register circuit writing data from an addressed write register in parallel to a selected block of memory registers during a block write cycle, wherein the selected block of memory registers is a row of memory registers from the plurality of memory registers.

16. A random access memory integrated circuit comprising:
    a plurality of memory registers, each memory register comprising at least one memory cell;
    an address bus which receives memory register addresses that specify memory registers for reading and writing;
    a data bus which receives memory register data for writing to memory registers; and
    a multiple write register circuit having a plurality of individually addressable write registers, the multiple write register circuit writing data from an addressed write register in parallel to a selected block of memory registers during a block write cycle; and
    the multiple write register circuit comprising a write register decoder which is responsive to a write register address received from the data bus during a block write cycle to address a write register, the multiple write register circuit writing data from the addressed write register to the selected block of memory registers during said block write cycle.

17. A dynamic random access memory integrated circuit comprising:
    rows and columns of memory registers, each memory register comprising at least one dynamic memory cell;

a multiplexed address bus which sequentially receives memory register row and column addresses that specify rows and columns of memory registers for reading and writing;

a data bus which receives memory register data for writing to memory registers;

said address bus further receiving a memory register base address, said memory register base address specifying a predefined number of consecutively-addressed memory registers within a row for simultaneous writing; and a multiple write register circuit having a plurality of individually addressable write registers each corresponding in width to the memory registers; the multiple write register circuit providing data from an addressed write register to the predefined number of consecutively-addressed memory registers during a block write cycle.

18. The dynamic random access memory integrated circuit of claim 17 wherein the predefined number of memory registers is an entire row of memory registers.

19. The dynamic random access memory integrated circuit of claim 17 wherein the multiple write register circuit comprises a write register decoder which is responsive to a write register address received from the multiplexed address bus during a write register load cycle to address a write register for loading data to the addressed write register during said write register load cycle.

20. The dynamic random access memory integrated circuit of claim 17 wherein the multiple write register circuit comprises a write register decoder which is responsive to a write register address received from the data bus during a block write cycle to address a write register, the multiple write register circuit writing data from the addressed write register to the predefined number of consecutively-addressed memory registers during said block write cycle.

21. The dynamic random access memory integrated circuit of claim 17 wherein the multiple write register circuit comprises a write register decoder which is responsive to a first write register address received from the multiplexed address bus during a write register load cycle to address first write registers for loading during said write register load cycle; the write register decoder being responsive to a second write register address received from the data bus during a block write cycle to address a second write register; the multiple write register circuit writing data from the second write register to the predefined number of consecutively-addressed memory registers during said block write cycle.

22. The dynamic random access memory integrated circuit of claim 17 wherein said dynamic random access memory integrated circuit receives a column address strobe signal that strobes memory register column addresses onto the multiplexed address bus during memory register access cycles; the column address strobe signal strobing write register addresses onto the multiplexed address bus during write register load cycles, wherein said write register addresses specify write registers to be loaded during said write register load cycles.

23. The dynamic random access memory integrated circuit of claim 17 wherein:

said dynamic random access memory integrated circuit receives a column address strobe signal that strobes memory register column addresses onto the multiplexed address bus during memory register access cycles;

the column address strobe signal strobes write register addresses onto the multiplexed address bus during write register load cycles, wherein said write register addresses specify write registers to be loaded during said write register load cycles; and the multiple write register circuit comprises a write register decoder which is responsive to a plurality of write register addresses which are successively strobed onto the multiplexed address bus during a write register load cycle to successively address a plurality of write registers for loading.

24. The dynamic random access memory integrated circuit of claim 17 further comprising a column masking circuit to mask individual columns of memory registers within the predefined number of consecutively-addressed memory registers from being written to during a block write cycle.

25. The dynamic random access memory integrated circuit of claim 17 further comprising a column masking circuit which is responsive to a column mask code received from the data bus during a block write cycle to mask individual columns of memory registers within the predefined number of consecutively-addressed memory registers from being written to during said block write cycle.

26. The dynamic random access memory integrated circuit of claim 17 further comprising a bit masking circuit which is responsive to a bit mask code to mask bits of memory registers from being written to during said block write cycle.

27. The dynamic random access memory integrated circuit of claim 17 wherein:

the multiple write register circuit comprises a write register decoder which is responsive to a write register address received from the data bus during a block write cycle to address a write register, the multiple write register circuit providing data from the addressed write register to the predefined number of consecutively-addressed memory registers during said block write cycle; and the dynamic random access memory integrated circuit further comprises a column masking circuit which is responsive to a column mask code received from the data bus during said block write cycle to mask individual columns of memory registers within the predefined number of consecutively-addressed memory registers from being written to during said block write cycle.

28. The dynamic random access memory integrated circuit of claim 17 wherein:

the multiple write register circuit comprises a write register decoder which is responsive to a write register address to address a write register, the multiple write register circuit providing data from the addressed write register to the predefined number of consecutively-addressed memory registers during a block write cycle;

the dynamic random access memory integrated circuit further comprises a column masking circuit which is responsive to a column mask code to mask individual columns of memory registers within the predefined number of consecutively-addressed memory registers from being written to during said block write cycle; and the write register address and the column mask code are concurrently received from the data bus during said block write cycle.

29. In a random access memory integrated circuit having an array of randomly addressable memory registers, blocks of said memory registers being selectable for block writing from a write register during a block write cycle, a method of performing a block write cycle, comprising:
- storing data in a plurality of write registers, each of the write registers being selectively connectable for writing to a common one of the selectable blocks of said memory registers;
- addressing one of the write registers from among the plurality of write registers; and
- writing data from the addressed write register in parallel to a selected block of memory registers.

30. The method according to claim 29 wherein the selected block of memory registers comprises a row of memory registers from the array.

31. The method according to claim 29 further comprising:
- storing data in a plurality of write registers by receiving first write register addresses from a first signal bus and writing data to write registers having the first write register addresses; and
- addressing a write register by receiving a second write register address from a second signal bus and addressing a write register having the second write register address.

32. The method according to claim 29 wherein the predefined number of memory registers comprises a row of memory registers from the plurality of memory registers.

33. In a random access memory integrated circuit having a plurality of memory registers, the memory integrated circuit having an address bus for receiving memory register addresses and a data bus for receiving and producing memory register data, a method of writing to a selected block of the memory registers in a block write cycle, comprising:
- receiving a first write register address from the address bus during a write register load cycle;
- storing data in a first write register associated with the first write register address during said write register load cycle;
- receiving a second write register address from the data bus during a block write cycle;
- receiving a memory register base address;
- addressing a second write register associated with the second write register address during said block write cycle;
- addressing a predefined number of consecutively-addressed memory registers including a memory register having the memory register base address during said block write cycle; and
- writing data from the second write register in parallel to the predefined number of consecutively-addressed memory registers during said block write cycle.

34. The method according to claim 33 wherein the address bus is multiplexed for sequentially receiving memory register row and column addresses, the method further comprising receiving multiple column address strobe signals during a write register load cycle to indicate receiving multiple first write register addresses during said write register load cycle.

35. The method according to claim 33 further comprising receiving an address strobe signal to indicate when the first write register addresses are received.

36. The method according to claim 33 further comprising receiving multiple address strobe signals during a write register load cycle to indicate receiving multiple first write register addresses during said write register load cycle.

37. The method according to claim 33 further comprising receiving a bit mask code and in response to the bit mask code masking bits of memory registers from being written to during said block write cycle.

38. The method according to claim 33 further comprising receiving a register mask code from the data bus during said block write cycle and in response to the register mask code masking individual memory registers within the predefined number of consecutively-addressed memory registers from being written during said block write cycle.

39. The method according to claim 33 further comprising receiving a register mask code from the data bus concurrently with receiving the second write register address and in response to the register mask code masking individual memory registers within the predefined number of consecutively-addressed memory registers from being written during said block write cycle.

40. The method according to claim 33 wherein the address bus is multiplexed for sequentially receiving memory register row and column addresses, the method further comprising receiving a column address strobe signal to indicate when the first write register addresses are received.

41. In a random access memory integrated circuit having an array of randomly addressable memory registers, blocks of said memory registers being selectable for block writing from a write register during a block write cycle, a method of performing a block write cycle, comprising:
- storing data in a plurality of write registers;
- addressing one of the write registers from among the plurality of write registers; and
- writing data from the addressed write register in parallel to a selected block of memory registers;
- receiving a memory register base address; and
- addressing a predefined number of consecutively-addressed memory registers including a memory register having the memory register base address, the predefined number of consecutively-addressed memory cells constituting the selected block of memory registers.

* * * * *